United States Patent [19]

Butt

[11] Patent Number: 4,853,491

[45] Date of Patent: Aug. 1, 1989

[54] CHIP CARRIER

[75] Inventor: Sheldon H. Butt, Godfrey, Ill.

[73] Assignee: Olin Corporation, New Haven, Conn.

[21] Appl. No.: 781,080

[22] Filed: Sep. 27, 1985

Related U.S. Application Data

[63] Continuation of Ser. No. 657,433, Oct. 3, 1984, abandoned.

[51] Int. Cl.$^4$ .............................................. H05K 1/02
[52] U.S. Cl. ................................ 174/52.4; 174/52.2; 174/52.3; 174/68.5
[58] Field of Search ............. 174/68.5, 52 FP, 52 PE, 174/52.4, 52.2; 361/386, 387, 388, 401

[56] References Cited

U.S. PATENT DOCUMENTS

| | | | |
|---|---|---|---|
| 3,165,672 | 1/1965 | Gellert | 361/387 |
| 3,296,099 | 1/1967 | Dinella | 174/68.5 X |
| 3,341,369 | 9/1967 | Caule et al. | 148/2 |
| 3,475,227 | 10/1969 | Caule et al. | 148/6.31 |
| 3,495,023 | 2/1970 | Hessinger | 361/388 X |
| 3,546,363 | 12/1970 | Pryor et al. | 174/525 |
| 3,611,046 | 10/1971 | Covert | 361/388 |
| 3,618,203 | 11/1971 | Pryor | 357/74 |
| 3,676,292 | 7/1972 | Pryor et al. | 161/196 |
| 3,676,569 | 7/1972 | Thompson | 174/52.3 |
| 3,676,748 | 7/1972 | Kobayashi et al. | 361/421 |
| 3,698,964 | 10/1972 | Caule et al. | 420/103 |
| 3,714,370 | 1/1973 | Nixen et al. | 174/52.3 |
| 3,726,987 | 4/1973 | Pryor et al. | 357/81 |
| 3,730,779 | 5/1973 | Caule et al. | 357/67 |
| 3,762,039 | 10/1973 | Douglass et al. | 437/217 |
| 3,801,728 | 4/1974 | Gallo, Jr. et al. | 174/52.4 |
| 3,810,754 | 5/1974 | Ford et al. | 420/445 |
| 3,826,627 | 7/1974 | Pryor et al. | 29/195 |
| 3,826,629 | 7/1974 | Pryor et al. | 29/191 |
| 3,837,895 | 9/1974 | Pryor et al. | 428/422 |
| 3,852,148 | 12/1974 | Pryor et al. | 428/433 |
| 3,875,478 | 4/1975 | Capstick | 361/386 X |
| 4,054,938 | 10/1977 | Morris | 361/401 |
| 4,105,861 | 8/1978 | Hascoe | 174/52.4 |
| 4,109,054 | 8/1978 | Burgyan | 428/433 |
| 4,147,889 | 4/1979 | Andrews et al. | 174/52 FP |
| 4,172,272 | 10/1979 | Schneider | 174/52 PE X |
| 4,385,202 | 5/1983 | Spinelli et al. | 174/68.5 |
| 4,408,256 | 10/1983 | Val | 361/414 X |
| 4,461,924 | 7/1984 | Butt | 174/52 FP |
| 4,684,818 | 8/1972 | Netherwood | 174/52.4 |

FOREIGN PATENT DOCUMENTS

| | | |
|---|---|---|
| 1907567 | 9/1969 | Fed. Rep. of Germany . |
| 2269793 | 11/1975 | France . |
| 2381388 | 9/1978 | France . |
| 0090566 | 10/1983 | Japan . |

OTHER PUBLICATIONS

"Clad Metal Circuit Board Substrates for Direct Mounting of Ceramic Chip Carriers" by Dance and Wallace, First Annual Conference of the International Electronics Packaging Society, Cleveland, Ohio, 1981.
"Use of Metal Core Substrates for Leadless Chip Carrier Interconnection: by Lassen, Electronic Packaging and Production", Mar. 1981, pp. 98–104.
"Chip–Carriers, Pin–Grid Arrays Change the PC–Board Landscape" by Lyman, Electronics, Dec. 29, 1981, pp. 65–75.
"Chip Carriers: Coming Force in Packaging" by Frickson, Electronic Packaging and Production, Mar. 1981, pp. 64–80.
Betz et al., Monolithic Chip Carrier, IBM Tech. Disc. Bull, vol. 9, #11, Apr. 1967, p. 1511.

Primary Examiner—R. R. Kucia
Attorney, Agent, or Firm—Gregory Rosenblatt; Paul Weinstein

[57] ABSTRACT

A chip carrier and a process of assembling a chip carrier are disclosed. The carrier used for mounting a chip comprises a copper or copper base alloy component having a thin refractory oxide layer on a surface thereof. The surface and the oxide layer have an indentation formed therein for receiving the chip. A metallic circuit pattern for electrical connection to the chip is bonded to the oxide layer and insulated from the copper or copper base alloy by the refractory oxide layer. A seal is provided for enclosing the chip to the indentation. Another embodiment of the invention includes a circuit board structure comprising a circuit board device having a first coefficient of thermal expansion. A chip carrier is provided having a second coefficient thermal expansion of substantially the same value as the first coefficient of thermal expansion. The chip carrier has electrical leads soldered to the circuit board whereby thermal cycling of the circuit board structure does not substantially stress the bond between the solder, leads and circuit board.

9 Claims, 2 Drawing Sheets

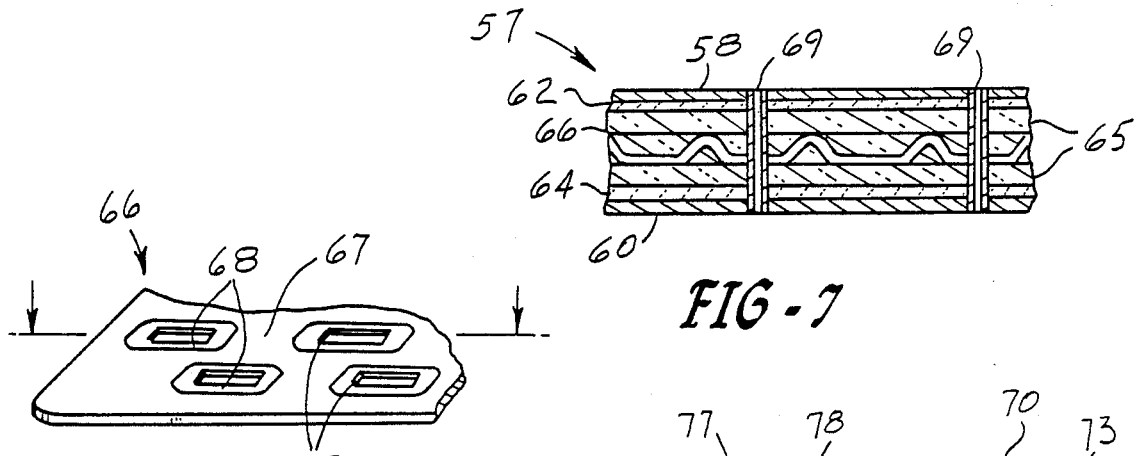
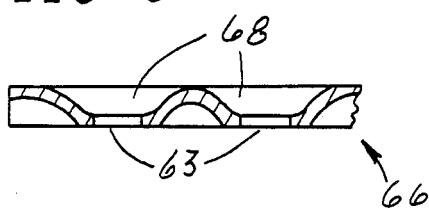
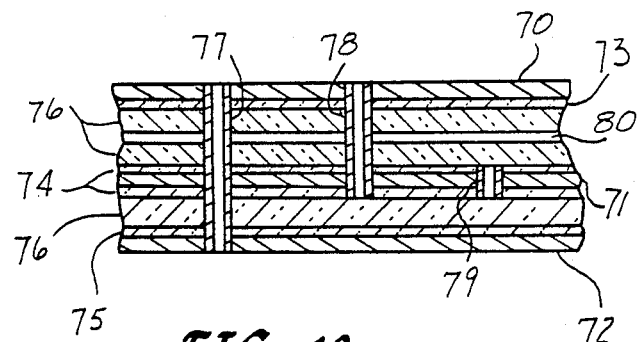
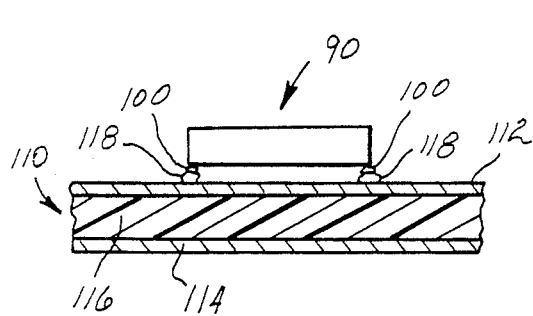
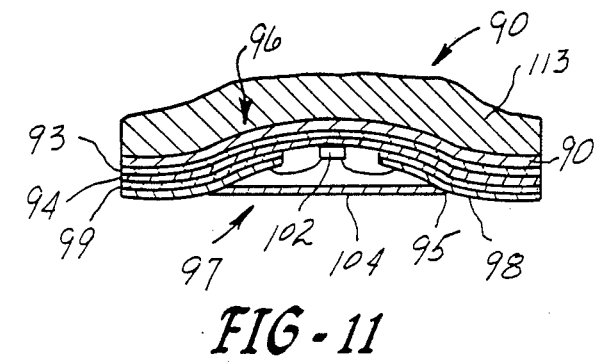
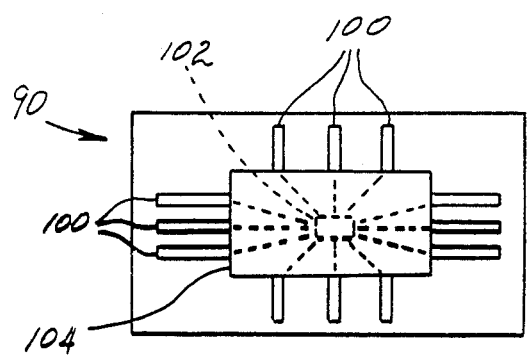

CHIP CARRIER

This application is a continuation of U.S. Patent Application Ser. No. 657,433, filed Oct. 3, 1984, by Sheldon H. Butt, for IMPROVED CHIP CARRIER, which is now abandoned.

The present invention relates to U.S. Patent Application Ser. Nos. 341,392 entitled "Semiconductor Casing" by S.H. Butt, filed Jan. 21, 1982, now U.S. Pat. No. 4,461,924; 369,699 entitled "Improved Printed Circuit Board" by S.H. Butt, filed Apr. 19, 1982, now U.S. Pat. No. 4,492,622; 390,081 entitled "Improved Semiconductor Package" by S. H. Butt, filed June 21, 1982, now abandoned; 390,095 entitled "Semiconductor Casing" by S. H. Butt, filed June 21, 1982, now U.S. Patent No. 4,410,927; 398,497 entitled "An Improved Semiconductor Casing" by S. H. Butt, filed July 15, 1982, now U.S. Pat No. 4,480,262; 405,640 entitled "Improved Hermetically Sealed Semiconductor Casing" by S. H. Butt, filed Aug. 4, 1982, now abandoned; 413,046 entitled "Multilayer Circuitry" by S.H. Butt, filed Aug. 30, 1982; 454,409 entitled "semiconductor Packages" by S. H. Butt, filed Dec. 29, 1982, now U.S. Pat. No. 4,524,238; 477,552 entitled "Reinforced glass composites" by S. H. Butt, filed Mar. 21, 1983, now U.S. Pat. No. 4,532,222; 517,592 entilted "Clad metal lead frame substrates" by S. H. Butt, filed July 27, 1983; 539,449 entitled "Low Thermal Exapansivity and high thermal conductivity substrate" by S. H. Butt, filed Oct. 6, 1983, now U.S. Pat. No. 4,569,692; 587,411 entitled "Tape Packages" by S. H. Butt, filed Mar. 8, 1984; 587,433 entitled "Tape Bonding Material and Structures for Electronic Circuit Fabrication" by S. H. butt, filed Mar. 8, 1984; 598,112 entitled "Hermetically Sealed Metal Package" by S. H. Butt, filed Apr. 2, 1984, now U.S. Pat No. 4,577,056; 651,984 entitled "Sealing Glass Composite" by E. F. Smith, III, filed Sept. 19, 1984; and 651,987 entitled "Sealing Glass Composite" by E.F. Smith, III et al., filed Sept. 19, 1984.

While the invention is subject to a wide range of applications, it is especially suited for use in printed circuit board applications and will be particularly described in that connection.

The printed circuit industry produces most printed circuits by adhering one or more layers of copper foil to organic materials such as glass fiber reinforced epoxy, phenolic laminated paper, polyester films, polyimide films, etc. Although widely used, these structures have certain deficiencies. Firstly, their maximum operating temperature is restricted by the maximum temperature tolerance of the organic substrate used. Secondly, a substantial mismatch usually exists between the coefficient of thermal expansion of the organic substrate and that of the copper foil, that of the solder compositions normally used to attach components to the circuitry and that of the components themselves. The coefficient of thermal expansion of the organic materials is normally substantially greater than that of the copper foil, the solder or the components being attached to the circuit. This mismatch results in substantial "thermal stresses" whenever the finished product is thermally cycled. These stresses create a variety of failure modes, such as tensile failure of the copper foil, failure of the solder attachment of components to the circuit and tensile failure of the components themselves.

To alleviate some of the problems associated with thermal stress, the industry uses two distinct types of metal core boards. One is an epoxy or other organic insulation over the metal core (either steel or aluminum), and the other is porcelain enameled steel.

The most popular is the metal core-organic type. Typically, the metal core, such as 0.050" thick aluminum, is drilled with oversized holes. As the core is coated with epoxy, the holes are filled with the epoxy. Copper foil is then bonded to one or both surfaces of the core. The holes are redrilled to a desired size and a liner of the epoxy (or other organic) is left in each hole. The finished metal core board compares to and may be processed as a standard plastic board. This may include electroless deposition of copper in the holes to provide current paths from top to bottom, etc. Better heat dissipation is provided by the metal core board as compared to the glass fiber reinforced epoxy type boards with rather poor thermal conductivity.

The second type of board, porcelain enameled steel, is considered either a metal core board or a metal clad board depending on the terminology. First, porcelain enamel (essentially a glassy material) is applied to a sheet of steel. A circuit pattern is screen printed on the surface of the porcelain enamel with one of the thick film "conductive inks" and the board is refired to create a continuous pattern of metallic conductive elements. Through-holes cannot be used due to problems with short circuiting and, therefore, multi-layer boards are not manufactured in this manner. The porcelain (glass) is rather thick and its thermal conductivity is relatively poor; in fact, it is even poorer than the thermal conductivity of plastics used in plastic boards or as a coating in metal core boards described above. It follows that the heat dissipation characteristics of the porcelain board are poor.

Conductive ink technology usually requires multiple applications of the conductive ink to build a conductor pattern which is thick enough to carry a desired electric current. The multiple screening and firing operations used in applying the conductive ink tend to be relatively complicated and expensive.

Presently, there is an increase in the circuit density of printed circuit boards. This creates a need for narrower and more closely spaced "wires" or lines on the printed circuit board. The minimum line width generated by the state of the art conductive ink technology is limited by the printing process for applying the conductive ink. Also, the final conductive ink (generally either copper- or silver-) porcelain-steel product frequently has problems relating to the metallized pattern. The pattern may have a substantially different (higher) coefficient of thermal expansion than the steel substrate. This causes a substantial shear force at the circuit-porcelain interface and substantial risk of failure during thermal cycling.

Many of the above-mentioned considerations regarding clad metal are described in a paper entitled "Clad Metal Circuit Board Substrates for Direct Mounting of Ceramic Chip Carriers" by Dance and Wallace and presented at the First Annual Conference of the International Electronics Packaging Society, Cleveland, Ohio, 1981. Also, an article entitled "Use of Metal Core Substrates for Leadless Chip Carrier Interconnection" by Lassen in *Electronic Packaging and Production,* March 1981, pages 98–104, discusses the latest technology in metal core substrates.

Presently, copper foil is adhered to an organic printed circuit substrate by electrodeposition of "coral copper" to the foil surface. The result is a rough surface with re-entrance cavities to receive the surface layer of the organic substrate and/or the organic adhesive to form a "locked" mechanical bond. Since the surface layer is a conductive metal structure (copper) embedded in the organic material, considerable care must be exercised to remove any residual coral copper treatment from the spaces between the final printed circuit lines. This avoids unwanted current passing between lines, bridging of solder across the spaces between lines, etc. In principal, removal of residual coral copper treatment from areas requires additional etching beyond that required to remove the base foil itself. This excessive etching leads to additional undercutting and partial destruction of the circuit pattern. Thus, the manufacturer of conventional copper foil-organic circuit boards must strike a balance between enough etching to reliably remove the coral copper treatment while minimizing excessive etching to prevent undercutting of the circuit pattern.

The increased complexity of circuitry for interconnecting various devices mounted upon a printed circuit board often requires that both surfaces of the board contain conductive patterns. Some of the interconnections are provided by the circuit pattern on the obverse face of the board (the surface to which the components are mounted), while other interconnections are provided upon the reverse side of the board. The interconnection between the obverse and reverse sides of the board may be provided by solder filled through-holes. Conventional two sided copper foil-organic boards of this general configuration are widely used. However, in state of the art porcelain enameled steel substrate boards, two sided boards are not practical since the solid and continuous steel substrate creates a continuous path for electrical conduction from one through hole to another.

In certain applications, the circuit requirements include a double sided or multi-layered board in which thermal exposure or other factors prevent the use of a copper foil-organic board. An alternative is a metal circuit pattern on both sides of a suitable ceramic, non-conductive substrate with interconnection between the two circuits by conductive through-holes. This technique is used on specialized printed circuit boards and upon substrates for hybrid packages.

As integrated circuits become larger (more individual functions on a single silicon chip), and there is a corresponding increase in the number of leads for interconnection, the principal means of integrated circuit interconnection, the dual-in-line (DIP) package becomes impractical. A DIP includes a lead frame with the leads emerging from the package and formed into "pins". As its name indicates, the DIP package has two rows of pins, one on either side of the package. The pins are inserted and soldered into holes in a printed circuit board. Characteristically, the pins are spaced apart on 0.100" centers. A relatively simple device requiring a 20 lead package, 10 on a side, will be approximately 1" long. A 40 lead DIP package is about 2" long and a 64 lead DIP package, about the largest now made, is approximately 3.2" long. For reasons relating to geometry, as the packages become longer with more pins, they become wider. Typically, the width of the completed package is approximately one-third its length. For both mechanical and electronic reasons, DIP packages with more than 64 leads are considered impractical to manufacture. However, large-scale integrated circuits often require more interconnections than provided by DIP packages. Even with smaller integrated circuits, the circuits are spaced together on the printed circuit board as closely as possible. Obviously, the package size limits the closeness of the spacing. Therefore, the semiconductor industry has a growing interest in "chip carriers".

Chip carriers deal with the problems of largescale circuits requiring more interconnections than provided by a DIP package as well as reduction of package size for intermediate sized integrated circuits to increase component density on the printed circuit board. The term chip carrier, in its broadest sense, relates to packages, both ceramic and plastic. The configuration of a chip carrier may be essentially square and leads emerge from within the package on all four sides. Furthermore, typical center-to-center spacing of leads on a chip carrier is 0.050". Thus, a 64 lead device having a "footprint" of roughly 3.25"×1.1" in a DIP package has a "footprint" of approximately 0.8"×0.8" in a chip carrier package. More importantly, the area covered by the chip carrier would be approximately 18% of that covered by the DIP package. At this time, chip carrier packages with 128 and more leads are being produced.

The principal constraint in establishing 0.100" as the normal spacing between leads on the DIP package is the insertion of the lead pins into holes on the printed circuit board. Allowing for the hole, a pad area around the hole for solder adhesion and spacing between the holes to electrically isolate them from each other, it becomes difficult to crowd them much closer together.

Typically, the coefficient of thermal expansion of the DIP package is different from that of the printed circuit board. The extent to which board and package dimensions change with varying temperature can be accommodated by deflection of the leads, i.e. between the printed circuit board and the package. Effectively, the leads become spring members which accommodate the differences in coefficient of expansion.

State of the art chip carriers having 0.050" leads are not normally mounted by insertion of the leads into holes in the printed circuit boards. Instead, most chip carriers use a surface mounting technique in which the lead forms a pad mounted flush to the printed circuit board and is soldered in place. The metallized pads on the exterior surface of the chip package are integral with the package and expand and contract with the package. There is no accommodation for deflection of leads due to changes in board and package dimensions, as in the case of DIP packages, during thermal cycling. As a result, the solder bond between the pad and the board is subjected to substantial stresses. The stresses increase as the total package size becomes larger and/or the board's operation is in an expanded temperature range. Repeated stressing of the solder bond leads to fatigue failure.

As with DIP packages, chip carrier packages may use a plastic package or may require a hermetic package. With the DIP package, essentially the same external configuration is employed for a hermetic (Ceramic Dual-In-Line Package) or a plastic package. In both configurations, the flexible leads accommodate for differential thermal expansion.

The "standard" glass cloth reinforced epoxy board material has a coefficient of thermal expansion of $15.8 \times 10^{-6}/°C$. Ceramic chip carriers usually made from an aluminum oxide ceramic have a coefficient of thermal expansion of $6.4 \times 10^{-6}/°C$. If thermal conductivity is particularly important, they made be made from beryllium oxide also having a coefficient of thermal expansion of $6.4 \times 10^{-6}/°C$. In either event, there is a substantial mismatch in coefficient of thermal expansion between the board and the chip carrier. Therefore, substantial stresses are imposed on the solder bond when subjected to significant thermal cycling.

One solution has been to surface mount the chip carrier to a metallized pattern on an aluminum oxide ceramic substrate. The substrate has the same coefficient of thermal expansion as the chip carrier. Pins may be brazed to the alumina substrate and plugged into holes in the printed circuit board. Although this sort of configuration avoids problems associated with mismatch in coefficient of thermal expansion, it also has the effect of sacrificing much of the space saving advantage of the chip carrier.

A description of the latest technology with respect to chip carriers is presented in an article entitled "Chip-Carriers, Pin Grid Arrays Change the PC-Board Landscape" by Jerry Lyman, *Electronics*, Dec. 29, 1981, pages 65–75. Another article entitled "Chip Carriers: Coming Force in Packages" by Erickson, in *Electronic Packaging and Production*, March 1981, pages 64–80 discusses the construction and other details concerning chip carriers.

U.S. Pat. No. 3,546,363 to Pryor et al. discloses a composite metal product for use as a seal to glasses and ceramics which has properties of a low coefficient of expansion, approximating that of the appropriate glasses and ceramics, good thermal conductivity, and fine grain size in the annealed condition.

U.S. Pat. Nos. 3,546,363; 3,618,203; 3,676,292; 3,726,987; 3,826,627; 3,826,629; 3,837,895; 3,852,148; and 4,149,910 disclose glass or ceramic to metal composites or seals wherein the glass or ceramic is bonded to a base alloy having a thin film of refractory oxide on its surface.

U.S. Pat. Application Ser. No. 261,330, filed May 7, 1981 now abandoned to Butt et al. discloses for example, "a process for thermosonically bonding leadwires to leadframes having a thin refractory oxide layer".

U.S. Pat. Application Ser. No. 341,392, filed Jan. 19, 1982 (now U.S. Pat. No. 4,461,924) to Butt discloses for example, "a highly reliable metal casing which is sealed and bonded using an adhesive".

It is a problem underlying the present invention to provide a chip carrier and a chip carrier mounted on a circuit board which can accommodate-substantial thermal cycling.

It is an advantage of the present invention to provide a chip carrier and a chip carrier mounted on a circuit board which obviate one or more of the limitations and disadvantages of the described prior arrangements.

It is a further advantage of the present invention to provide a chip carrier and chip carrier mounted on a circuit board which substantially reduce the formation of stresses between the chip carrier and the circuit board due to thermal cycling.

It is a still further advantage of the present invention to provide a chip carrier and chip carrier mounted on a circuit board which are relatively inexpensive to manufacture.

It is a further advantage of the present invention to provide a chip carrier and chip carrier mounted on a circuit board having improved heat dissipation.

Accordingly, there has been provided a chip carrier and a process of assembling a chip carrier. The carrier used for mounting a chip comprises a copper or copper base alloy component having a thin refractory oxide layer on a surface thereof. The surface and the oxide layer have an indentation formed therein for receiving the chip. A metallic circuit pattern for electrical connection to the chip is bonded to the oxide layer and insulated from the copper or copper base alloy by the refractory oxide layer. A seal is provided for enclosing the chip to the indentation. Another embodiment of the invention includes a circuit board structure comprising a circuit board device having a first coefficient of thermal expansion. A chip carrier is provided having a second coefficient thermal expansion of substantially the same value as the first coefficient of thermal expansion. The chip carrier has electrical leads soldered to the circuit board whereby thermal cycling of the circuit board structure does not substantially stress the bond between the solder, leads and circuit board.

The invention and further developments of the invention are now elucidated by means of preferred embodiments shown in the drawings:

FIG. 7 is a cross-sectional view of a printed circuit board having circuits on opposite surfaces and a metal grid therebetween;

FIG. 8 is a top view of a metal grid used for reinforcement of a printed circuit board;

FIG. 9 is a view through 9—9 of FIG. 8;

FIG. 10 is a side view of a multi-layer printed circuit board in accordance with the present invention;

FIG. 11 a side view of a leadless chip carrier in accordance with the present invention;

FIG. 12 is a view through 11—11 of FIG. 10; and

FIG. 13 is a side view of a leadless chip carrier mounted upon a printed circuit board in accordance with the present invention.

Figure 1:
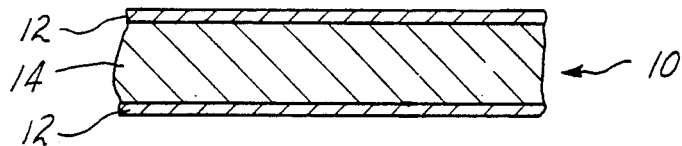
FIG. 1 is a cross section of a prior art printed circuit board.

As shown in FIG. 1, prior art printed circuits 10 are produced by adhering one or more layers of copper foil 12 to organic material 14 such as glass fiber reinforced epoxy, phenolic laminated paper, etc. These structures have several deficiencies including restricted maximum operating temperature due to the organic substrate and substantial mismatch between the coefficient of thermal expansion of the organic substrate and that of the copper foil, the solder compositions to attach components to the circuitry and the components themselves. Substantial thermal stresses, resulting from the mismatch, create failure modes such as tensile failure of the copper foil, failure of the solder attachment of components to the circuit and tensile failure of the components themselves.

Figure 2:
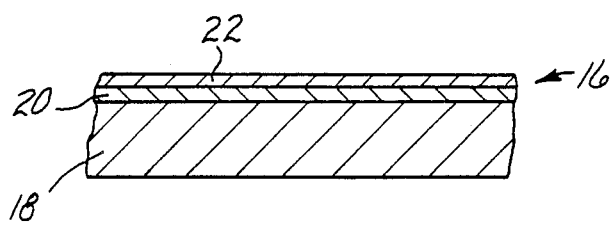
FIG. 2 is a cross section of a metal core prior art printed circuit board.

There is some use of metal core boards 16 found in FIG. 2. Typically, these include a metal core 18, a copper foil 22 and an epoxy insulating layer 20 bonded to both layer 20 and foil 22. This type of board provides better heat dissipation than the normal glass fiber reinforced epoxy boards but still has the restricted maximum operating temperature related to the organic substrate. Also, substantial mismatch between the coefficient of thermal expansion of the organic substrate and the copper foil causes the types of problem associated with conventional printed circuits as shown in FIG. 1.

Figure 3:
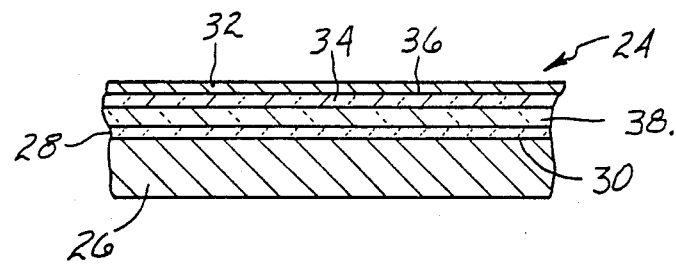
FIG. 3 is a cross section of a printed circuit board having a glass component bonded between the refractory oxide coating of two copper alloys in accordance with the present invention.

The present invention overcomes these problems by providing a composite or printed circuit board 24 as shown in FIG. 3. The composite may include a first metal or metal base alloy component 26 having a thin refractory oxide layer 28 on at least a first surface 30 thereof and a second thin refractory oxide layer 34 on at least surface 36 of a metal or metal base alloy component 32. A glass component 38 is bonded to the first and second thin refractory oxide layers 38 and 34 to insulate the component 26 from the second component 32.

The preferred alloy for use in the embodiments of the present invention is a copper base alloy containing from 2 to 12% aluminum and the balance copper. Preferably, the alloy contains from 2 to 10% aluminum, 0.001 to 3% silicon, and if desired, a grain refining element selected from the group consisting of iron up to 4.5%, chromium up to 1%, zirconium up to 0.5%, cobalt up to 1% and mixtures of these grain refining elements and the balance copper. In particular, CDA alloy C6381 containing 2.5 to 3.1% aluminum, 1.5 to 2.1% silicon, and the balance copper is useful as a substrate for this invention. Impurities may be present which do not prevent bonding in a desired environment.

The alloys useful with this invention and, especially alloy C6381 as described in U.S. Pat. Nos. 3,341,369 and 3,475,227 to Caule et al. which disclose copper base alloys and processes for preparing them, have a refractory oxide layer formed to one or more of its surfaces. The oxide layer may include complex oxides formed with elements such as alumina, silica, tin, iron chromia, zinc, and manganese. Most preferably, the refractory oxide layer is substantially aluminum oxide ($Al_2O_3$). The formation of the refractory oxide to the substrate may be accomplished in any desired manner. For example, a copper base alloy such as alloy C6381 may be preoxidized in gases having an extremely low oxygen content. The C6381 may be placed in a container with 4% hydrogen, 96% nitrogen and a trace of oxygen released from a trace of water mixed in the gas. This gas may be heated to a temperature of between about 330° C. and about 820° C. Depending on the temperature and amount of time the alloy is left in the heated gas, a refractory oxide layer of a desired thickness forms on the surface of the alloy.

The present invention is not restricted to applications of alloy C6381 but includes the broad field of metal or alloys which have the ability to form continuous refractory oxide layers on their surface. Several examples of other metal alloys such as nickel base and iron base alloys are disclosed in U.S. Pat. Nos. 3,698,964, 3,730,779 and 3,810,754. Alloy C6381 is particularly suitable for this invention because it is a commercial alloy which forms such films when heated. The copper or copper base alloy component may also include composite metals in which the refractory oxide forming metal or alloy is clad upon another metal by any conventional technique. This other metal may be another copper alloy or any other metal whose bulk properties are desired for a specific application.

The present invention uses any suitable glass or ceramic component 38, such as cited in the patents above, preferably with a coefficient of thermal expansion which closely matches the metal components. The glass is bonded to the thin refractory oxide layers 28 and 34 and functions to adhere the metal components together and electrically insulate them from each other. Since the glass and the copper alloy substrates preferably have the same or closely matched coefficients of thermal expansion, thermal stresses in the system may be essentially eliminated and the problems associated with thermal stress in the finished product alleviated.

Table I lists various exemplary glasses and ceramics which are adapted for use in accordance with this invention.

TABLE I

| Glass or Ceramic Type | Coefficient of Thermal Expansion, in./in./°C. |
|---|---|
| Ferro Corp.[1] No. RN-3066-H | $167 \times 10^{-7}$ |
| Ferro Corp.[1] No. RN-3066-S | $160 \times 10^{-7}$ |

Figure 4:
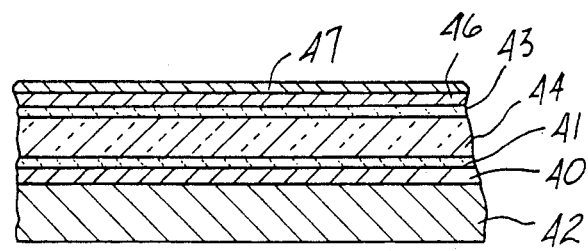
FIG. 4 is a printed circuit board having high thermal conductivity substrates bonded to copper alloy components.

Referring again to the embodiment as illustrated in FIG. 3, a foil layer 32 is bonded to a thicker supportive layer 26 by means of glass 38. The foil 32 may be subsequentially treated with a "resist" pattern and etched to produce a printed circuit. The result is a wrought copper alloy circuit pattern bonded to and insulated from a wrought copper alloy supportive substrate 26 by a layer of glass 38 which serves as both an adhesive and an insulating material. This configuration has a number of advantages over the prior technique of printing circuitry upon the surface of porcelain with conductive ink. Firstly, in the prior conductive ink technology, multiple layers of the conductive ink are applied to provide an adequate conductive pattern for the required electric current. However, the circuit foil 32 may be of any desired thickness and replaces the multiple screening and firing operations by a single firing operation and a single etching operation. Secondly, recent increases in circuit density of printed circuit boards create a need for narrower and more closely spaced printed "wires" or lines. The prior conductive ink technology is limited to the minimum line width generated by the printing process. The present invention, however, etches copper foil and provides narrow lines and spaces as in conventional etched copper foil, organic substrate circuits. Thirdly, the metallized pattern formed on the conductive ink-porcelain-steel circuit board has a substantially higher coefficient of thermal expansion than the steel substrate. Thermal cycling develops substantial shear forces at the circuit-porcelain interface creating substantial risk of failure. The embodiment of FIG. 3 substantially eliminates these shear forces because the coefficient of thermal expansion of the circuit foil and the metal substrate may be substantially the same.

Where greater conductivity than that inherent in the metal or alloys producing bondable alumina and silica films is desired, a composite copper alloy foil incorporating a higher conductivity layer, as shown in FIG. 4, may replace the solid alloy 32 as in the previous embodiment.

The embodiment of FIG. 4 includes bondable copper alloy substrate 40 and circuit foil 46 having refractory oxide layers 41 and 43, respectively. A glass or ceramic 44 is bonded between the oxide layer 43 on circuit foil 46 and the oxide layer 41 on the copper base alloy 40. Substrate 40 is bonded, as a composite, to a copper or high conductivity copper alloy thicker component 42. The latter provides for superior thermal dissipation from the board as compared to both conventional copper foil-organic boards and porcelain on steel boards. Also, foil 46 may be bonded as a composite to a copper or high conductivity copper alloy component 47 for superior electrical or thermal conductivity. It is also within the scope of the present invention to provide only one of the components 42 or 47 as required. It is also within the scope of the present invention to modify any of the described embodiments by bonding the component, as a composite, to a metal layer having desired physical properties.

Figure 5:
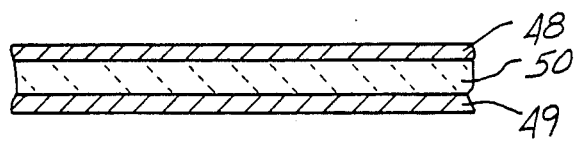
FIG. 5 is a cross-sectional view of a printed circuit board with a fused refractory oxide layer between two substrates.

The embodiment as shown in FIG. 5 provides copper alloy substrates 48 and 49 each forming a refractory oxide layer. These refractory layers are fused together into layer 50 and dispense with the provision of glass. The unified refractory oxide layer 50 both adheres the metal substrates 48 and 49 and insulates them from each other. It is within the scope of the invention to substitute the glass in the embodiments of the present invention with fused refractory layers as desired.

The complexity of the circuitry for interconnecting the various devices mounted upon a printed circuit board often requires that both surfaces of the board contain conductive patterns. Details of prior art two sided circuit boards are described in the background of the invention.

Figure 6:
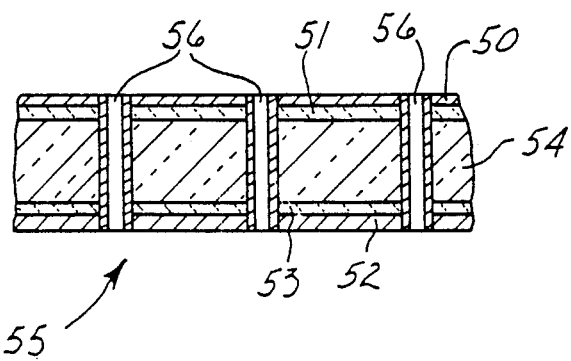
FIG. 6 is a printed circuit board having circuits on opposite surfaces and interconnections therebetween.

A two sided circuit board configuration 55, as shown in FIG. 6, has two relatively thick layers of copper base alloy components 50 and 52, each having a thin refractory oxide layer 51 and 53, respectively, on at least one surface. The components are bonded together and insulated from one another by a glass or ceramic 54 which is fused to the oxide layers 51 and 53. A circuit pattern is formed on each of the components 50 and 52 by a conventional technique. The thickness of each metal component is established in accordance with the desired stiffness of the finished board. The circuit patterns on each side of the board 55 must be carefully designed to provide reasonable stiffness and to avoid planes of weakness. Such planes might develop if an area of considerable size without any circuitry on one side of the board coincides with a similar area on the reverse side of the bond. Through-holes 56 may be provided in the circuit board by any conventional technique such as drilling or punching. The through-holes may be formed into a conductive path by any suitable means such as electroless deposition of copper on their walls. If desired, the through-holes can then be filled with a conductive material such as solder.

Another embodiment of a two sided metal glass printed circuit board 57, as shown in FIG. 7, includes two copper alloy substrates 58 and 60, each having a thin refractory oxide layer 62 and 64, respectively, bonded on at least one surface. A glass component 65 is fused to the layers 62 and 64. A grid 66, preferably metal, is bonded in the glass 65 and insulated from the alloy substrates 58 and 60. The recesses 68 of the grid may be filled with glass 65 or any other suitable inorganic filler. Through-holes 69 are formed in the board as described above. The result is a board with the same design flexibility as conventional foil-organic boards but with the advantage of substantial elimination of thermal stresses. The metal grid both stiffens the board 57 and permits a plurality of through-holes 69 to pass through openings 68 of the grid. The through-holes must not contact the metal grid to avoid short circuits.

The metal grid is preferably made of a copper alloy having a thin refractory oxide layer on both surfaces. It is, however, within the scope of the present invention to use any desired material to construct the grid. The grid may be formed with any desired configuration, and a typical one is shown in FIG. 8. A series of recesses 68 are stamped in a metal sheet 67. Subsequently, the bottom 71 of the recesses are pierced leaving a pattern of interlocking "V" bars, as shown in FIG. 8, for reinforcement.

The need for still greater circuit complexity than provided by a two sided circuit board leads to multi-layer circuit boards with three or more layers of copper foil. Using the concepts described hereinabove, a multi-layer board composed of alternate layers of copper alloy foil having a thin refractory oxide layer on each surface in contact with the glass insulator is described. As shown in FIG. 10, copper foil components 70, 71 and 72 have their refractory oxide layers 73, 74 and 75, respectively, bonded to glass 76. The foil components may each be provided with circuitry as in the embodiments described above. Also, the components may be bonded as composites to other metals with desired physical properties as described above. It is thought that the thicker multi-layer boards will be sufficiently rigid. Where additional rigidity is required, grid reinforcement as described and illustrated in FIG. 7 may be added. Also, through-holes 77, 78 and 79 between the circuits, as described above, may be provided as necessary. Note that the through-holes may be between any number of circuits.

Since the power consumption of most board mounted electronic components is quite modest, the heat generated during their operation is comparably small. However, as packaging density becomes greater, more elaborate means for cooling must be provided. The present invention provides for cooling of the multilayer printed circuit boards, as shown in FIG. 10, by bonding high thermal conductivity layers of copper alloy to the circuit foil, as in FIG. 4. This layer of copper alloy functions to conduct heat from the board. It is within the scope of the invention to provide one or more layers of conductive material 80 within the multi-layer board. Material 80 may be a solid strip of high thermal conductivity material such as copper or copper alloy. It may be desirable to use a copper alloy having a refractory oxide layer for improved bonding to the glass 76. Naturally, any through-holes may require insulation from the strip 80. The conductive material 80 may comprise one or more tubular members embedded in the glass to provide coolant passages. Again, it is preferable that the copper tubing have a thin refractory oxide layer on its surface to bond to the glass.

Another important aspect of the present invention resides in the provision of a leadless ceramic chip carrier which can be directly mounted to the surface of a printed circuit board. This chip carrier substantially eliminates excessive stressing of the solder bond to the circuit board which generally occurs during thermal cycling of the chip carrier-printed circuit board systems as described hereinabove. Referring to FIGS. 11 and 12, there is illustrated a leadless chip carrier 90 wherein a copper base alloy substrate 92 with a thin refractory oxide layer 93, such as $Al_2O_3$, provided on one surface thereof is substituted for the prior art alumina or beryllia ceramic. A non-adhesive glass or ceramic 94 may be fused onto the oxide layer as described above. It is, however, within the scope of the invention to use only the oxide layer. As can be seen in FIG. 11, the copper alloy 92 may be shaped with a slight indentation 96, exaggerated in the drawing to better clarify the concept. It is within the scope of the present invention to form the indentation in any desired configuration. A metal circuit foil 98, which may be formed of the same material as 92, having a refractory oxide layer 99, is bonded to the non-adhesive glass 94 or oxide layer 93 and etched in any conventional manner to provide a metallic circuit including electrical leads 100. A chip 102 is preferably attached to the glass 94 by any conventional technique and lead wires connected between the circuitry on the chip and the leads 100.

The chip may be sealed within the indentation 96 by several techniques. Preferably, the sealing device 97 may be a cover plate 104 comprising a copper or copper base alloy having a thin refractory oxide layer thereon. Glass 95 is fused onto at least the edges of the cover 97. This non adhesive glass can be bonded to either the refractory layer 99 on the component 98 or to the glass 94 as required. The result is to hermetically seal the chip 102 in the leadless chip carrier 90. Another embodiment provides the seal by filling the indentation 96 with an epoxy. The epoxy will bond to the leads and the glass and provide an adequate but not necessarily hermetic seal.

Referring to FIG. 13, the leadless chip carrier 90 is affixed to a typical printed circuit board 110. This board has copper foil 112 and 114 separated by glass cloth reinforced epoxy 116. A circuit is provided on the foil 112. The leadless chip carrier may be applied directly onto the circuitry of strip 112 by solder pads 118 between the lead 100 and the foil 112 in a conventional manner.

Alloy C6381, the preferred material of alloy components 92 and 98 of the chip carrier, has a coefficient of thermal expansion of $17.1 \times 10^{-6}/°C$. This is only 8.2% different from the coefficient of thermal expansion of conventional glass cloth reinforced epoxy which is $15.8 \times 10^{-6}/°C$. This is a vast improvement over chip carriers formed of alumina ceramic which have a coefficient of thermal expansion of $6.4 \times 10^{-6}/°C$., i.e. approximately 144% greater than the thermal expansion of the alumina ceramic. The result is a significant decrease in the formation of stress between the solder, leads and circuit board due to thermal cycling.

As the number of individual functions incorporated upon a single silicon chip becomes larger, the amount of heat generated requiring dissipation increases accordingly. Also, as the number of functions become greater, they are packed more closely together on the chip which further magnifies the problem of heat dissipation. It is a further advantage of the present invention that the thermal conductivity of alloy C6381 is 24 Btu/ft$^2$/ft/hr/°F. This is 131% greater than the thermal conductivity of alumina oxide (typically used for chip carriers) which is 10.4 Btu/ft$^2$/ft/hr/°F. Also, the thermal resistance imposed between the chip and the exterior means of heat dissipation is reduced because of the thinner sections of the tougher material such as 6381 which are able to replace the thicker, more fragile and brittle materials such as alumina ceramics. It should be noted that in certain applications, beryllia with a thermal conductivity of 100 Btu/ft$^2$/ft/hr/°F. is used as a substrate for better heat dissipation despite its extremely high cost.

Referring again to FIG. 11, the copper alloy component 92 with a refractory oxide layer may be clad upon copper or any high conductivity alloy substrate 113. Assuming that the composite metal is approximately 10% alloy C6381 clad upon 90% alloy C151, the overall thermal conductivity is 196 Btu/ft$^2$/ft/hr/°F. This is 18.8% better than the thermal conductivity of alumina and 63% better than that provided by beryllia. In addition, there is the additional advantage of a thinner chipless carrier as compared to a thicker alumina carrier.

The surface mounted hermetic chip carrier as described above and illustrated in FIG. 12 will resolve most of the normal problems associated with the effect of thermal cycling on a chip carrier that is surface mounted to a conventional glass cloth reinforced epoxy printed circuit board. However in some cases, a closer match of coefficient of thermal expansion may be required and/or greater heat dissipation capability may be necessary. In these cases, a metal board configuration of the types described hereinabove and illustrated in FIGS. 2–7 and 10 may be substituted for the conventional printed circuit board.

In one embodiment, reduced mismatch of thermal expansion and greater heat dissipation can be achieved by mounting a chip carrier of the type illustrated in FIGS. 11 and 12 on a prior art printed circuit board as shown in FIG. 2 where the core is copper or a high conductivity copper alloy. An alloy may be desirable if greater strength is required than may be provided with pure copper. A suitable plastic insulating layer 20 is appropriately bonded to the copper or copper alloy core and in turn, the printed circuit foil 22 is bonded to the insulating layer. The plastic must be suitable for bonding with adhesives, have suitable dielectric characteristics and the ability to withstand processing temperatures such as soldering. The thermally conductive plastics may be particularly useful for the plastic layer. These plastics typically contain metal powders to improve their thermal conductivity while maintaining dielectric properties since the metal powders are not in a continuous phase. Since the plastic is only thick enough to provide the necessary dielectric properties, resistance to heat transfer from the chip carrier to the high conductivity copper or copper alloy core is minimized. It can be appreciated that the coefficient of thermal expansion of the metal board is essentially the same as that of the glass coated chip carrier and, therefore, stresses induced by thermal cycling of the system are substantially eliminated. This configuration is limited by the temperature capability of the plastic or plastics and the temperature resistance of the adhesives which are used in conjunction with the plastics.

To improve the maximum temperature capability of the leadless chip carrier and printed circuit board combination, a printed circuit board as illustrated in FIG. 3 may be used in conjunction with the leadless chip carrier 90 shown in FIG. 11. In this configuration, the metal core consists of copper or a high conductivity copper alloy 26 to which is clad alloy C6381 or an alternative glass bondable copper alloy. In turn, a printed circuit foil 32 consisting of a glass bondable copper alloy such as C6381 is bonded to the glass 38. The alloy bonded to the C6381 may be selected from copper or high conductivity copper alloys so as to improve the electrical conductivity in the circuit or to provide optimum solder ability characteristics. The system is completely inorganic and will withstand temperatures much higher than systems with organic materials and further avoids various modes of degradation to which organic materials are susceptible.

An additive circuit may be substituted for photoetched foil 48 in FIG. 5. The circuit may be generated upon a glass coating applied to the refractory oxide layer on alloy C6381 or other glass bondable alloy core material 49 using conventional techniques employed in generating additive circuits. For example, the additive circuit may be a pattern printed upon the surface of the glass with conductive ink and fired into place. It is also within the scope of the present invention for the alumina film which may be formed by heating the alloy to be used as the dielectric layer separating the metal core from the additive circuit.

Whereas an oxide layer has been described as being formed by separately heating the metal or alloy, it may be formed in any manner such as during the process of bonding the metal or alloy to the glass, ceramic or another oxide layer.

Whereas the chip carrier has been described as leadless, it is also within the scope of the present invention to substitute a chip carrier with leads.

The patents, patent applications and publications set forth in this application are intended to be incorporated by reference herein.

It is apparent that there has been provided in accordance with this invention a composite, a chip carrier and a system of mounting the chip carrier with the composite which satisfies the objects, means, and advantages set forth hereinabove. While the invention has been described in combination with the embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A leadless chip carrier adapted for mounting a chip, comprising:
    a copper base alloy substrate adapted to support the chip, said substrate having an indentation adapted to received said chip;
    a copper base alloy circuit foil adapted to be electrically connected to said chip;
    said circuit foil and said substrate having a desired coefficient of thermal expansion;
    a bonding component having a coefficient of thermal expansion of at least about $160 \times 10^{-7}$ in/in/°C. for bonding said circuit foil to said substrate, said coefficient of thermal expansion of said bonding component being closely matched to said desired coefficient of thermal expansion; and
    means bonded to said circuit foil for enclosing said indentation and forming an enclosure adapted to seal said chip within said chip carrier.

2. A leadless chip carrier as in claim 1 wherein said circuit foil has an electrical circuit etched therein.

3. A leadless chip carrier as in claim 2 comprising said bonding component being selected from the group consisting of glass and ceramics.

4. A leadless chip carrier as in claim 3 comprising said desired coefficient of thermal expansion being about $171 \times 10^{-7}$ in/in/°C.

5. A leadless chip carrier as in claim 3 wherein the copper base alloy of said copper base alloy substrate and said copper base alloy circuit foil comprises an effective amount of up to about 12% aluminum to form a refractory oxide and the balance essentially copper.

6. A chip carrier as in claim 5 wherein both said copper base alloy substrate and said circuit foil consist essentially of 2.5 to 3.1% aluminum, 1.5 to 2.1% silicon and the balance essentially copper.

7. A leadless chip carrier as in claim 4 wherein said substrate includes a high conductivity clad for increasing the thermal conductivity of said substrate.

8. A leadless chip carrier as in claim 4 wherein said copper base alloy substrate and said copper base alloy foil each have a refractory oxide layer on at least one surface for enhancing the bond to said bonding component.

9. A leadless chip carrier as in claim 8 wherein the refractory oxide layers include $Al_2O_3$.

* * * * *

UNITED STATES PATENT AND TRADEMARK OFFICE
CERTIFICATE OF CORRECTION

PATENT NO. : 4,853,491

DATED : August 1, 1989

INVENTOR(S) : SHELDON H. BUTT

It is certified that error appears in the above—identified patent and that said Letters Patent is hereby corrected as shown below:

Column 14, please insert ---10. A leadless chip carrier as in claim 3 wherein said means bonded to said circuit foil comprises epoxy type material disposed within said indentation adapted to seal said chip within said chip carrier---.

---11. A leadless chip carrier as in claim 3 wherein said means bonded to said circuit foil comprises a copper base alloy cover having a coefficient of thermal expansion of about 171 x $10^{-7}$in/in/°C, said cover having a refractory oxide layer at least along its outer edge, said cover being bonded at least along its outer edge to said circuit foil with the bonding component whereby said chip carrier is adapted to hermetically seal said chip within said indentation---.

Signed and Sealed this

Seventeenth Day of March, 1992

*Attest:*

HARRY F. MANBECK, JR.

*Attesting Officer*   *Commissioner of Patents and Trademarks*